United States Patent
Nishimura et al.

(12)

(10) Patent No.: US 6,363,002 B1
(45) Date of Patent: Mar. 26, 2002

(54) FERROELECTRIC MEMORY WITH BIPOLAR DRIVE PULSES

(75) Inventors: Akitoshi Nishimura, Plano, TX (US); Katsuhiro Aoki, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/224,616

(22) Filed: Dec. 31, 1998

(51) Int. Cl.$^7$ ............................................... G11C 11/22
(52) U.S. Cl. ...................................... 365/145; 365/207
(58) Field of Search ............................... 365/145–149, 365/196, 207–210

(56) References Cited

U.S. PATENT DOCUMENTS 5,086,412 A * 2/1992 Jaffe ........................... 365/145
5,541,872 A * 7/1996 Lowrey ....................... 365/145
5,835,400 A * 11/1998 Jeon ........................... 365/145

FOREIGN PATENT DOCUMENTS

JP 07 287999 A 10/1995
JP 08 147982 A 6/1996

OTHER PUBLICATIONS

Anonymous: "Bipolar Method for FE PC Storage Device Readout", IBM Technical Bulletin, vol. 13, No. 10, Mar. 1971, pp. 2853–2854, XP002116882; IBM Corp., New York, US, ISSN: 0018–8689.

"Non–Destructive Readout Method", IBM Technical Disclosure Bulletin, vol. 12, No. 10, Mar. 1970, pp. 1629–1631, XP002116883; IBM Corp., New York, US, ISSN: 0018–86898.

* cited by examiner

*Primary Examiner*—A. Zarabian
(74) *Attorney, Agent, or Firm*—Carlton H. Hoel; W. James Brady; Frederick J. Telecky, Jr.

(57) ABSTRACT

An FeRAM in which sensing occurs without a dummy cell, using an unselected bitline as a reference. The read cycle includes two opposed pulses on the drive line: the first pulse provides a data-dependent signal out of the selected cell, and the second pulse restores the bit line to a level such that the DC bias voltage on an unselected bitline provides an optimal reference.

21 Claims, 7 Drawing Sheets

PRIOR ART

$\Sigma Qn' = Q1' + Q2 + Q3$

FERROELECTRIC MEMORY WITH BIPOLAR DRIVE PULSES

BACKGROUND AND SUMMARY OF THE INVENTION

The present invention relates to Ferroelectric Random-Access Memories (FeRAMs), and to integrated circuits which include them.

BACKGROUND: THE USE OF SENSE AMPLIFIERS IN SEMICONDUCTOR MEMORIES

Semiconductor memories normally use memory cells which are made as small as possible. As a result, the electrical signals which come out of these cells when the read operation is performed are extremely small. Thus, the sensing of semiconductor memories is a critical technology, which affects many other performance parameters. See B. Prince, Semiconductor Memories (2.ed 1991), which is hereby incorporated by reference. This is particularly true for ferroelectric memories.

One simple example of this is in the art of DRAM sensing. In a DRAM cell, information is stored by charging the cell capacitor to one of two voltages. By connecting the capacitor later to a bit line voltage which is intermediate between those two voltages, the stored charge, when dumped into one line of a bit line, will make the voltage on that bit line slightly different from that of a matched bit line. The sense amplifier amplifies this voltage difference to produce a large signal, which can be sensed by further amplifier stages (optional), and eventually by logic output stages.

In memory architectures generally, it is not only undesirable to have too little read margin (which can result in errors), but it is also undesirable to have too much read margin. (In this case it would be possible to shrink the cell further while still obtaining accuracy.) Thus, properly designing the reference input for the sense amplifier is critically important to memory optimization. Where the profile of the possible output signals of the cell is relatively complex, as with ferroelectric memories, optimal tracking of the sense amplifier's reference is needed to provide the best possible margin of the sense amplifier. This translates directly into improvements in reliability and/or density.

BACKGROUND: FERROELECTRIC MEMORIES

Ferroelectric memories exploit the properties of ferroelectric materials, in which the induced electric field in the material is a nonlinear function of the applied voltage. See generally M. Lines and A. Glass, Principles and Applications of Ferroelectrics and Related Materials (1977), which is hereby incorporated by reference.

Ferroelectrics are analogous to ferromagnetic materials: just as the ferromagnetic material in a bar magnet can be permanently magnetized by applying a sufficiently strong magnetic field to it, and will thereafter act independently as a magnet, so a ferroelectric can acquire a fixed voltage gradient when a sufficiently strong electric field is applied to it.

This is useful in semiconductor memories, since ferroelectric materials have the potential to provide a non-volatile memory function. That is, after a ferroelectric material has been polarized in one direction, it will hold that polarization for a long time, and this provides non-volatile storage of information. (That is, the memory will retain its information even if it is not receiving any power supply voltage.)

Ferroelectric random-access memories ("FeRAM"s) have therefore been a very active area of memory development. See generally, e.g., papers 25.1–25.7, 34.5, and 34.6 from the 1997 IEDM; all of which, and the references cited in them, are hereby incorporated by reference.

However, the sensing requirements of ferroelectric memories are difficult. Since the information in a ferroelectric memory cell is stored by polarization of the ferroelectric material (and not simply as charge), its read mechanism is actually quite different from that from a DRAM, SRAM, or floating-gate memory.

Figure 5:
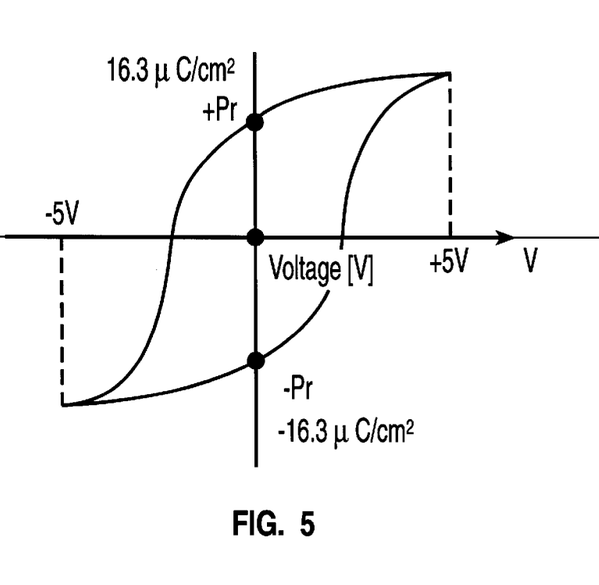
FIG. 5 shows the relation between stored charge and applied voltage for a typical ferroelectric capacitor.

FIG. 5 shows the "P/V" relation between stored charge density and applied voltage for a typical ferroelectric capacitor. Note that this curve has two values of charge for every value of voltage. Such curves are referred to as "hysteresis" curves. Depending on which polarization state the ferroelectric capacitor is in, a cell with stored data will either be at the "+Pr" point or at the "−Pr" point. ("Pr" is the spontaneous polarization density, and is measured in charge per unit area.) Note that the P/V hysteresis loop is nearly flat at these points, so a small change in voltage will not cause much charge transfer through the capacitor.)

Figure 3:
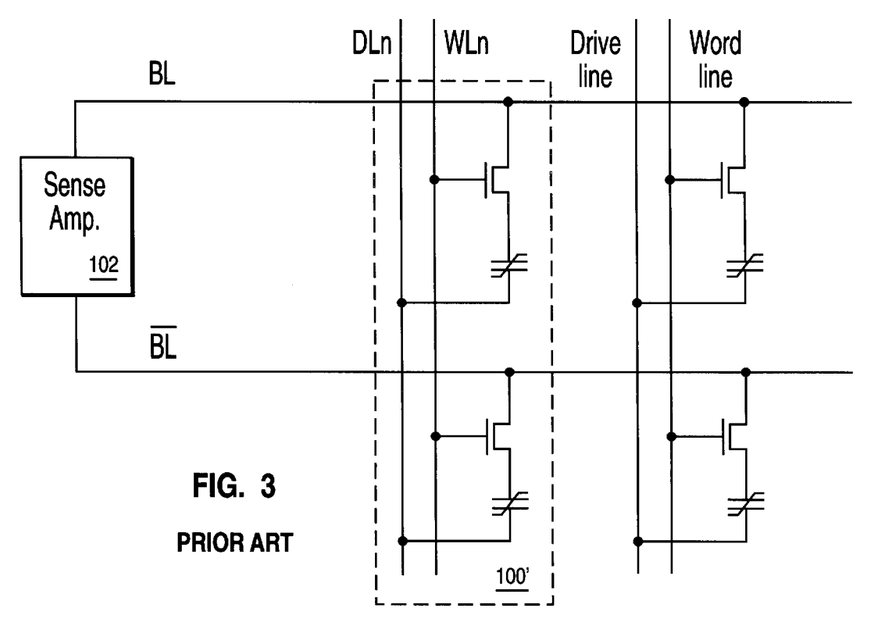
FIG. 3 shows a conventional two-transistor, two-capacitor type of FeRAM cell.

FIG. 3 shows a conventional two-transistor, two-capacitor type of FeRAM cell. In this case the unit cell 100', as indicated by a dotted line, includes two ferroelectric capacitors, each with its own pass transistor. The drive line $DL_n$ is connected to drive one terminal of the ferroelectric capacitor of each capacitor pair, and the wordline $WL_n$ is connected to open the pass transistors for both capacitors of a selected cell simultaneously. The two capacitor outputs then appear as a differential signal on the bit lines BL and BL\, and are amplified in a conventional differential sense amplifier 102. In such a cell, the capacitors of the cell pair are always written into opposite states, so that a relatively strong differential signal can always be obtained. However, this memory architecture is obviously not very area-efficient.

Figure 4:
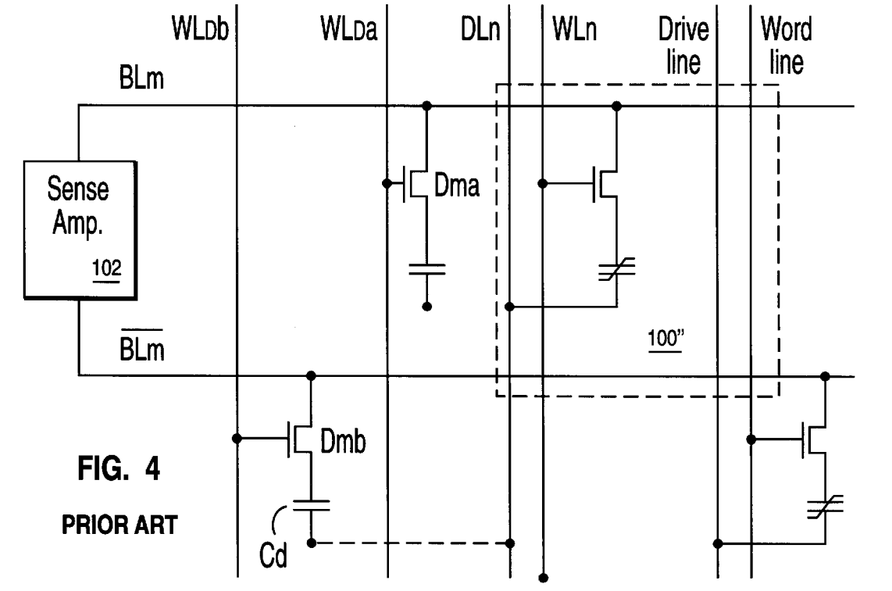
FIG. 4 shows a prior art 1T1C FeRAM cell, which uses a dummy cell for sensing.

FIG. 4 shows a further prior art cell. In this case, only one capacitor is used for memory in each cell. As indicated by the dotted line, a unit cell 100" includes one transistor and one capacitor, and hence this is referred to as a "1T1C" cell. Again, the wordline $WL_n$ is brought up to the positive logic level to turn on the pass transistor of the access cell. In this case the resulting output signal appears only as a single-ended signal on bitline $BL_m$ (or $BL_m\backslash$). The reference signal on the complementary bitline $BL\backslash_m$ (or $BL_m$) is supplied by a dummy cell $D_{mb}$ (or $D_{ma}$). The dummy cell $D_{mb}$, in this example, has a capacitor Cd whose lower terminal (as shown by the dashed connection) receives a signal equal to that on the drive line $DL_n$ of the selected cells, and whose pass transistor is activated by the dummy word line $WL_{db}$. This provides a reference voltage on the complementary bit line $BL\backslash_m$. However, this scheme is still quite difficult. The charge transfer through the ferroelectric capacitor of the selected cell, is dependent on its state of polarization and potentially different from that of a normal (paraelectric) capacitor like Cd.

Thus a disadvantage of the use of dummy cells in the prior art is that the dummy cell capacitor is not a ferroelectric capacitor, and thus its characteristics will not track those of a storage cell precisely. Moreover, the deposition and etch characteristics of the ferroelectric capacitor will not match those of a normal capacitor (which will typically have an oxide or oxynitride dielectric), so that process variation will not be identical between the two types of capacitor.

It is not practical to use a ferroelectric capacitor for the dummy cell, because complicated circuitry would be needed to drive the dummy cell properly. Moreover, the dummy cell consumes area.

Innovative Structures and Methods

The present application discloses a 1T1C ferroelectric memory architecture in which the read cycle includes two opposed pulses on the drive line: the first pulse provides a data-dependent signal out of the selected cell, and the second pulse restores the bit line to a level such that the DC bias voltage on an unselected bitline provides an optimal reference. (The second pulse also helps prepare the cell for restoration of its data state.) In some embodiments sensing occurs without a dummy cell, using an unselected bitline as a reference.

Advantages of the disclosed methods and structures include: A smaller cell area is realized in comparison with 2T2C cells; the disclosed scheme eliminates the complications of dummy cell schemes; a large voltage margin is available for accurate sensing; and good tolerance to power supply variations is achieved.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1A:
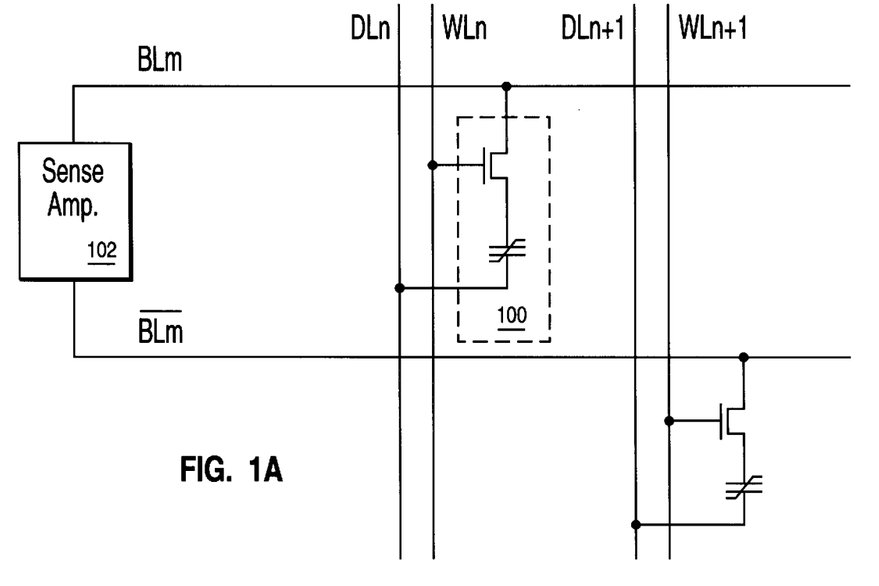
FIG. 1A shows the cell connections of an innovative 1T1C FeRAM cell array.
Figure 1B:
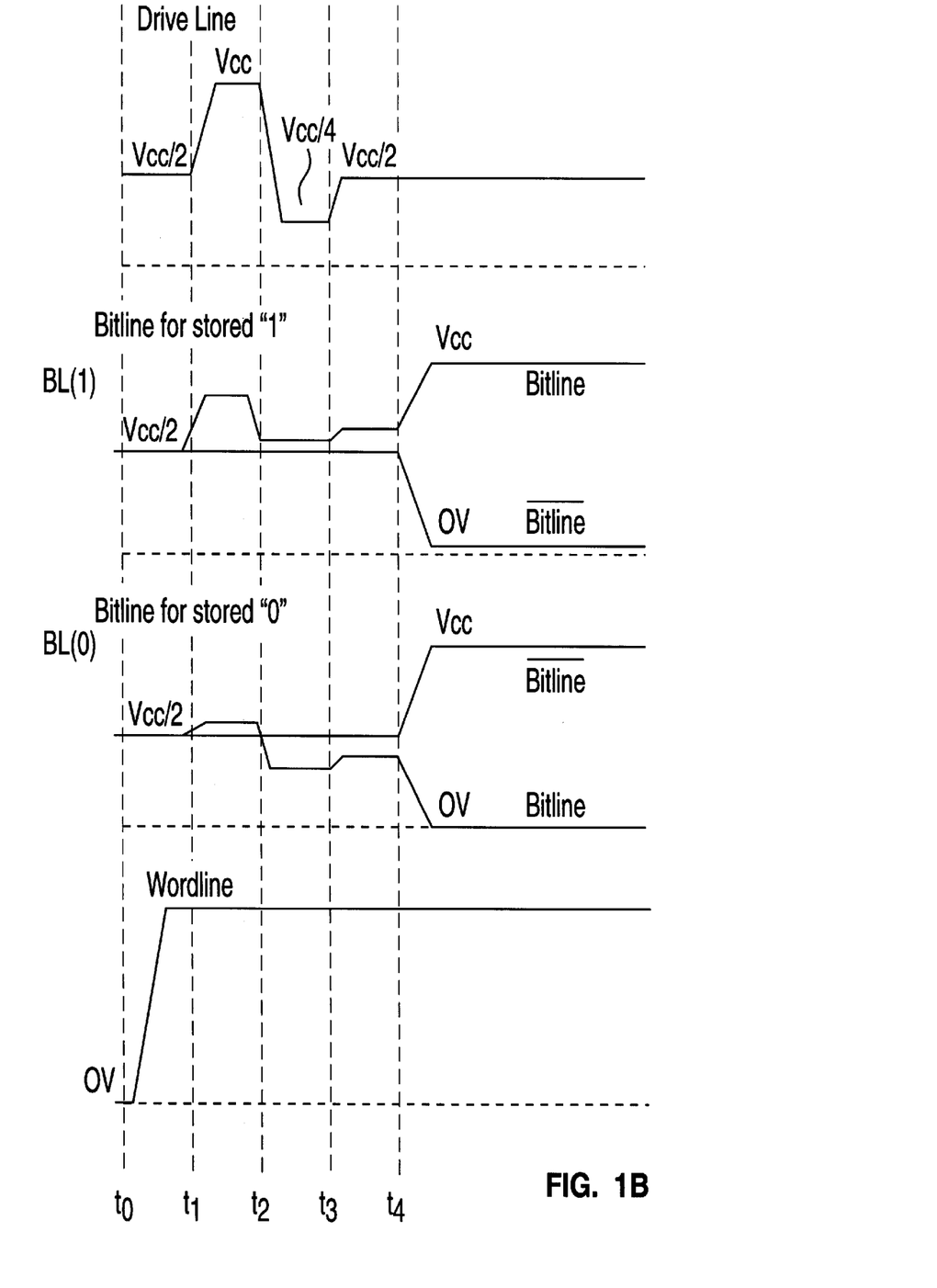
FIG. 1B is a timing diagram of the innovative read operation, in the FeRAM array of FIG. 1A.

FIG. 1A shows an innovative 1T1C FeRAM memory cell connection architecture, and FIG. 1B shows the waveforms applied to and resulting from that cell in its two states.

In FIG. 1A, each storage cell 100 is simply connected directly to a single one of the bit lines. In this example, the cell at array location (n,m) is connected to the m-th bit line $BL_m$, the nth drive line $DL_n$, and the nth word line $WL_n$. The sense amplifier 102 is connected to perform differential amplification between bit line $BL_m$ and a complementary bit line $BL\backslash_m$. Complementary bit line $BL\backslash_m$ is connected to a cell which is connected to receive the (n+1)th drive line $DL_{n+1}$ and the (n+1)th word line $WL_{n+1}$.

The present application discloses (in one class of embodiments) a 1T1C ferroelectric memory without a dummy cell. To make this work, the voltages of driveline, wordline, and bitline are operated in the following way, as shown in FIG. 1B.

Initially, the bit lines and drive lines are all precharged to half the supply voltage (Vcc/2). (The DC bias level of Vcc/2 is chosen to minimize the stress on the components.) This is step 110 in the flowchart of FIG. 2.)

Figure 2:
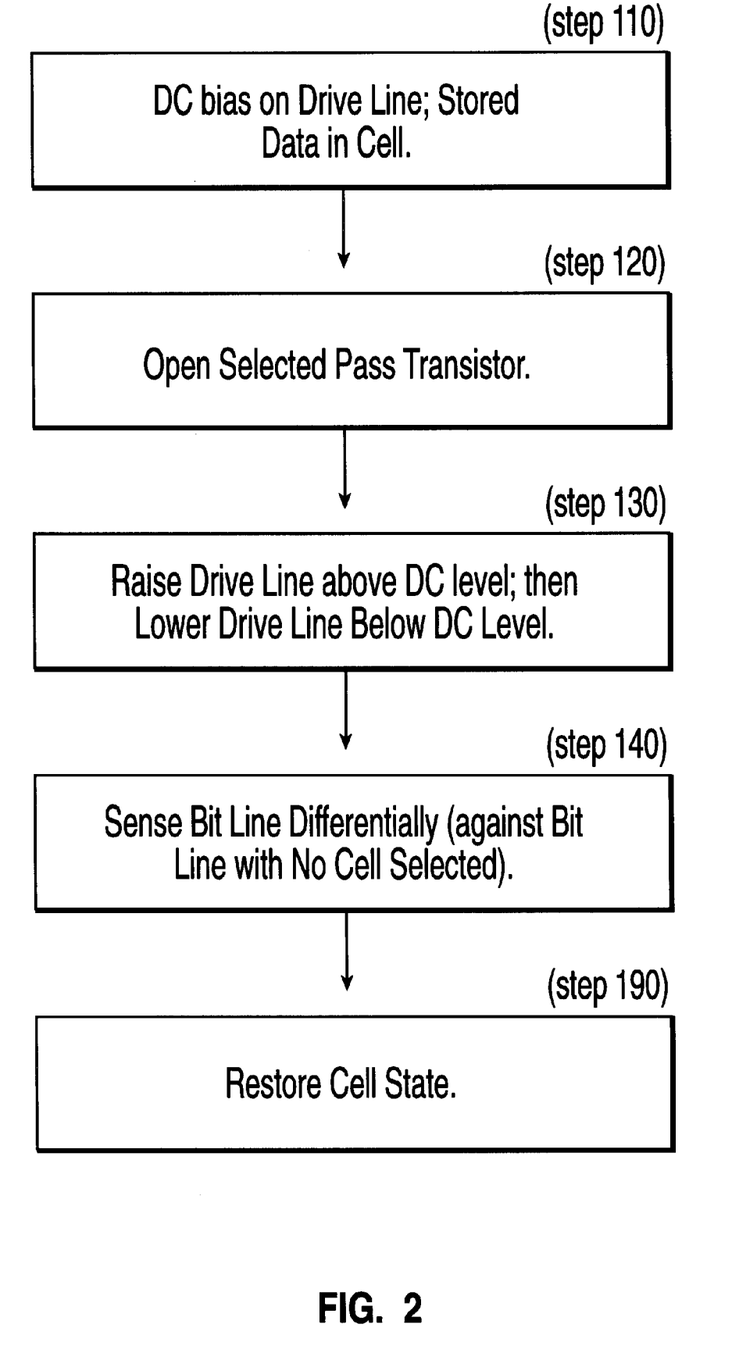
FIG. 2 is a flow chart of the steps in sample embodiments of the innovative FeRAM read operation.

The bitlines are then disconnected from power supply, and have a high impedance state.

When the word line goes high at time $t_0$ (step 120), the drive line is quickly thereafter driven with a fairly complex wave form as shown. (In FeRAMs as in DRAMs, the word line is typically driven with a boosted voltage, which is higher than the supply voltage.)

At time $t_1$, soon after the word line goes high, the drive line is driven up to $V_{cc}$ (in this example).

If the cell is starting from the +Pr point, then at time t1 (as the curve BL(1), labelled "Bit Line for Stored One", shows) the bit line voltage will rise by a large margin over the DC bias level of Vcc/2.

If the cell is starting from the +Pr point, then at time t1 (as the curve BL(0), "Bit Line for Stored Zero", shows) the bit line voltage increases only slightly over the DC bias level of Vcc/2.

This is a destructive operation, in that the ferroelectric material no longer retains the data originally stored in the cell. However, this data is now shown by the bit line voltage.

Thereafter (at time $t_2$) the drive line is driven down to a voltage which is below the DC bias voltage. (The drive line is driven down to Vcc/4 in this example, but other voltages below Vcc/2 can optionally be used.)

As the curve BL(1) shows, the bitline voltage will preferably still be above the DC bias level in this case.

As the curve BL(0) shows, the bitline voltage will fall well below the DC bias level in this case.

In either case, the voltage which is applied at this stage will set the intrinsic polarization of the ferroelectric film to approximately zero, and thus this step prepares for the eventual writeback which restores the state of the cell. This completes step 130.

Thereafter (at time $t_3$) the drive line is returned to its DC bias level (Vcc/2 in this example). The voltage of the bitline will be around +Pr/Cbit+Vcc/2 in the "1" case, where Cbit is the Bitline capacitance. (The bitline capacitance will typically be 7 or more times higher than the cell capacitance.) The voltage of the bitline will be around −Pr/Cbit+Vcc/2 in "0" case. As the curves of FIG. 1B show, the Vcc/2 level of an unselected bitline provides a reference level which is intermediate between these two states.

At time t4 the metastable positive-feedback sense amplifier is turned on, and the lines BL and BL\ diverge to complementary logic levels (Vcc and ground) which indicate the stored data. (This specific example assumes a clocked sense amplifier, but of course a variety of self-timing schemes for sensing can be used, as is well known by those skilled in the art.)

Figure 6A:
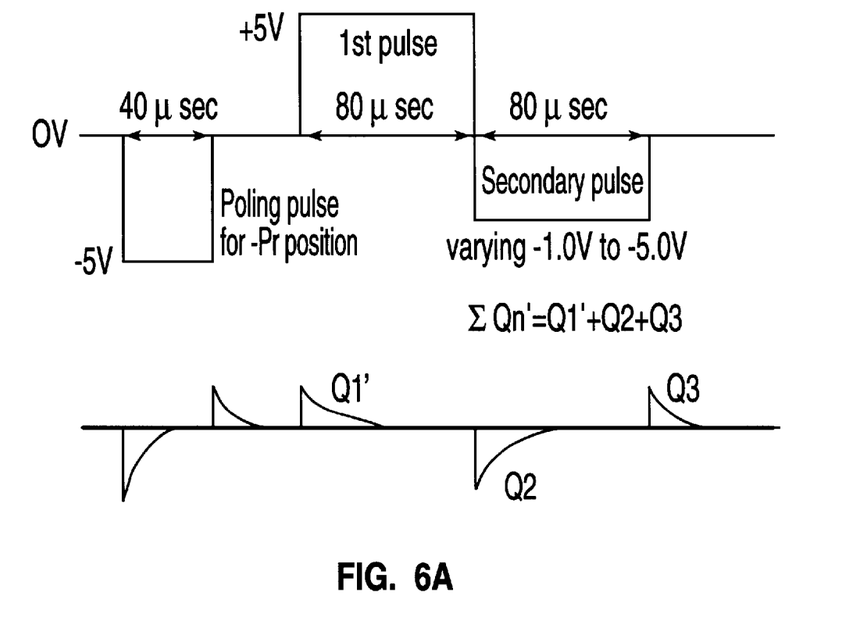
FIGS. 6A and 6B are an aligned pair of Figures which show the charge transfer through the cell of FIG. 1A during write and read operations.
Figure 6B:
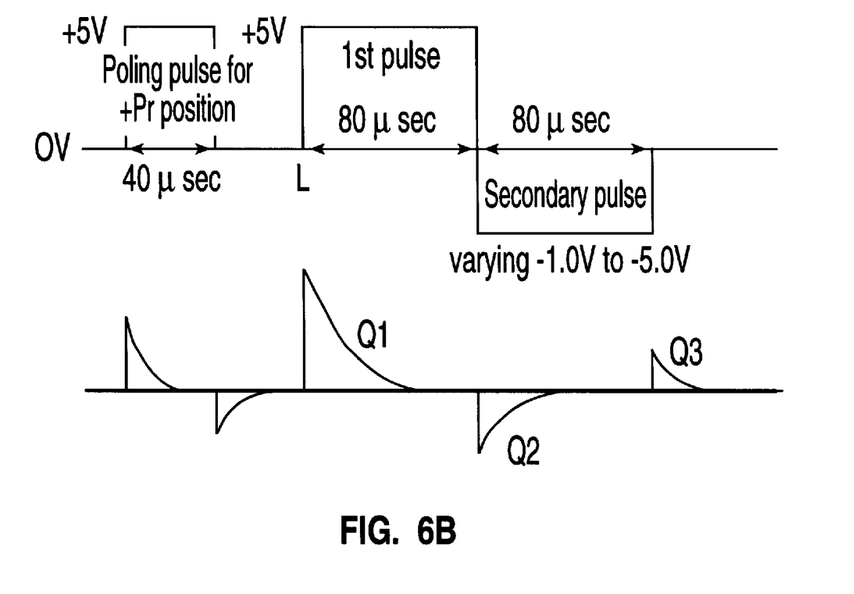

FIGS. 6A and 6B are an aligned pair of Figures which show the charge transfer through the cell of FIG. 1A during write and read operations. In FIG. 6A, the ferroelectric capacitor has initially been poled to the −Pr position. This is done, in this example, by applying negative 5 volts for 40 microseconds. The second trace of FIG. 6A shows the charge transfers appearing on the bit line as a result of this. Bit pulses Q1, Q2, and Q3 will appear on the bit line as a result of the drive pulses applied at times t1, t2, and t3. As may be seen from the voltage/time wave forms of FIG. 1B, when the drive line voltage goes high at time t1, a substantial output pulse Q1 will be seen from the capacitor which has been charged to the +Pr position, while a much smaller output pulse Q1' will be seen from the capacitor which has been charged to the −Pr position. (This results from the trajectories Q1 and Q1' seen on the hysteresis loop of FIGS. 7 and 8.) Thereafter, when the secondary pulse is applied at time t2 a negative going pulse Q2 will appear on the bit line in either case, and a further small positive pulse Q3 will appear at time t3 when the secondary pulse is ended. The sum of the pulses Q1 (or Q1') plus Q2 plus Q3 gives a net signal on the bit lines, which permits the correct read discrimination as shown in FIG. 1B. This net signal will now be further analyzed with reference to the traces of FIGS. 9 and 10.

Figure 7:
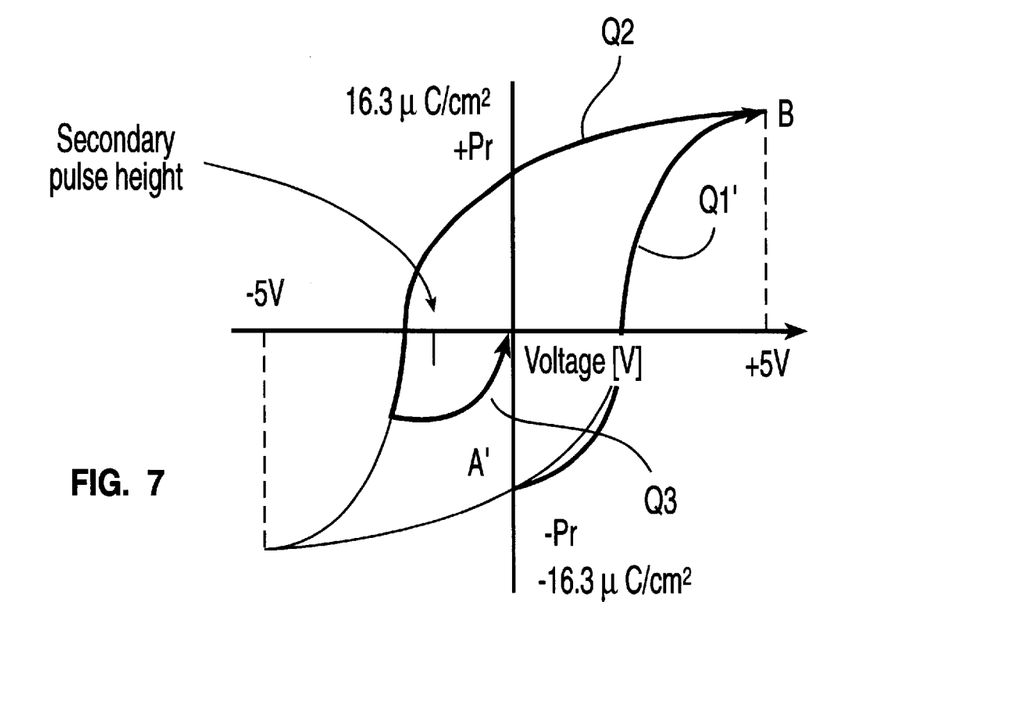
FIGS. 7 and 8 show two different P/V trajectories on the hysteresis loop of FIG. 5, corresponding to the read operations of FIG. 1B.
Figure 8:
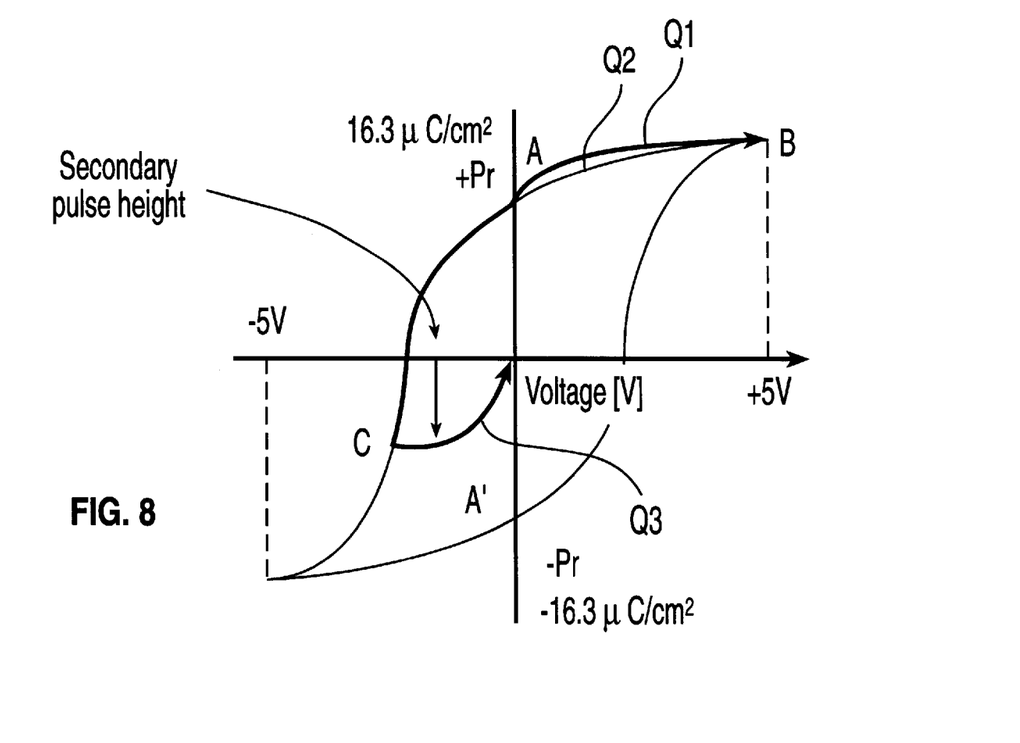

FIGS. 7 and 8 show how the charge and voltage of an FeRAM cell evolve, in the hysteresis loop of FIG. 5, depending on the starting state of the cell. Note that two trajectories are plotted. (In these curves, as in FIG. 5, the specific example is a ferroelectric capacitor which includes 300 nm of lead zirconium titanate between iridium electrodes, and has a Pr value of 16.3 microCoulombs per square cm.) FIG. 8 shows the trajectory for a read operation on a cell which starts out in the +Pr polarization. In this case, the initial read operation at time t1, when the drive line goes high, increases the stored charge in the cell only along trajectory line P1, from +Pr to the absolute maximum charge at vertex B. This is a relatively small change, and hence the voltage change at one plate of the capacitor is coupled almost directly through to the other plate of the capacitor. This is why the bit line shows a large voltage change (in the trace BL(1), labelled "bit line for stored one" in FIG. 1B). When the drive line thereafter drops below its DC bias level, the stored charge in the cell now shifts along trajectory Q2 back down to a point P. In this case, since a large change in the charge of the cell occurs for this voltage shift, the shift in the bit line voltage is relatively small at time t2, at least in comparison to the large change in the drive line. Note that the increase in the drive line voltage at time t1 is less than the change in the drive line voltage at time t2; yet when one has been stored, the change in the bit line voltage is larger at time t1 than at time t2. By contrast, for a stored zero, the change in the bit line voltage is smaller at time t1 than at time t2.

Thereafter, when the drive line voltage returns to its DC bias level, at time t3, the charge in this cell returns along trajectory Q3 to approximately a zero charge position.

Note that this is not the end of the process. The reading process just described has destroyed the stored data in the cell, but has stored the cell data in the sense amplifier. The sense amplifier now is applying a voltage of either Vcc or zero to the bit line, and the difference between this voltage and the drive line voltage (Vcc/2 in this example) will restore the cell to either +Pr or −Pr, at point A or A'. (Note that the transition to Vcc/4, at time t2, helps to prepare the cell for this write operation.)

Now refer to FIG. 7. In this case, the initial state of the capacitor was at point A' rather than at point A, i.e., at charge density of −Pr rather than +Pr. In this case, the increase of the drive voltage at time t1 again drives the stored charge to state B, but the trajectory to get to point A' to B is trajectory Q1'. This trajectory has a much higher vertical distance, and this shows that a much larger amount of charge is transferred into the cell capacitor for a zero cell than for a one cell, at time t1. This is why, in the curve BL(0) (labelled "bit line for stored zero"), the voltage increase in the bit line is much smaller at time t1 than in the curve for a stored one bit line: most of the change in drive voltage has gone to charging up the cell capacitor, and hence is not pumped through the cell. Thereafter, at time t2 and at time t3, the trajectories Q2 and Q3 are followed, just as in the example of FIG. 8. However, the large difference in voltage change at time t1 permits the sense operation to proceed correctly. This Figure shows the sense amplifier as not started until after time t3, which is preferable to obtain the optimum sensing margin; but the relation between t3 and t4 does not have to be exactly as shown. (For example, self-timed timing relationships can optionally be used.)

Figure 9:
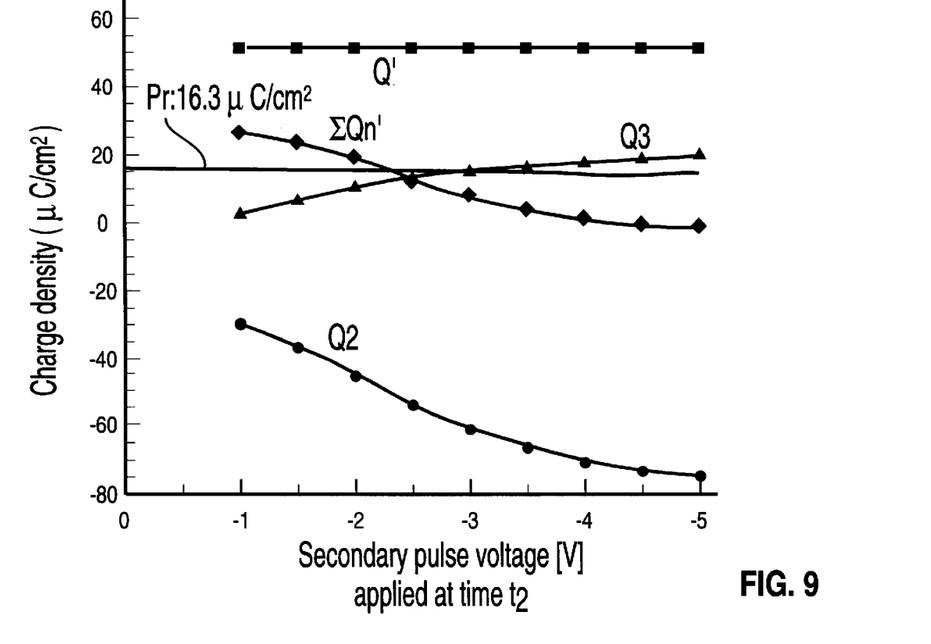
FIGS. 9 and 10 show a more detailed plot of the P(V) relationships which underlie the trajectories shown in FIGS. 7 and 8.
Figure 10:
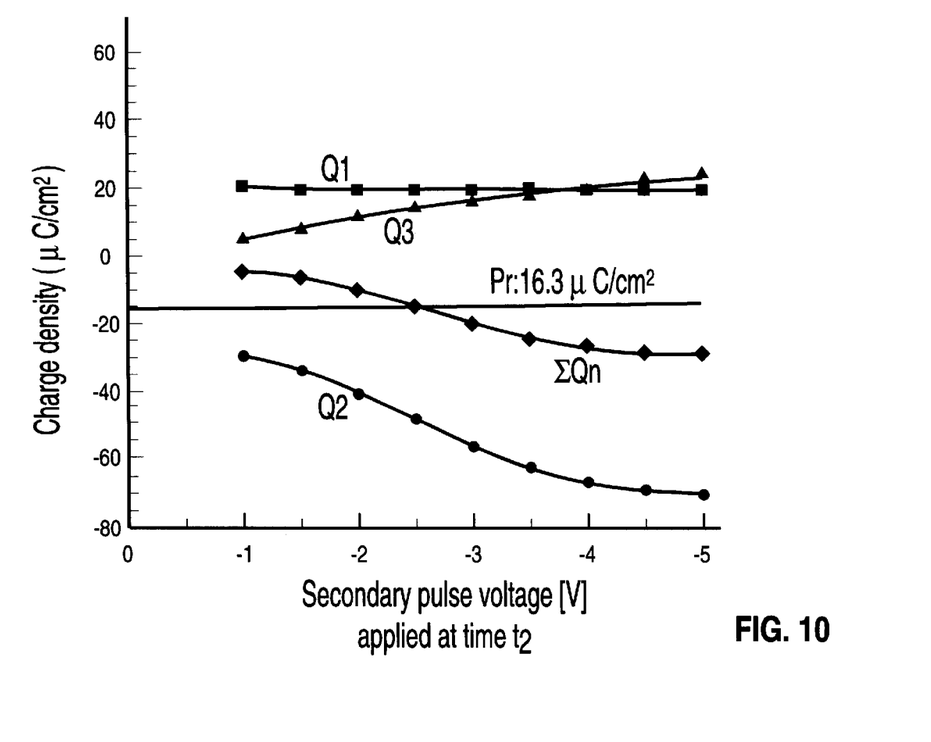

FIGS. 9 and 10 show a more detailed plot of the P(V) relationships which underlie the trajectories shown in FIGS. 7 and 8. FIG. 9 shows the case where the cell is initially in the −Pr position, that is where trajectory Q1' starts from point A', and FIG. 10 shows the case where the cell is initially in the +Pr position, that is where trajectory Q1 starts from the point labeled A. FIG. 10 shows how the charges have changed for a cell which begins from the +Pr position. In this case trajectories Q2 and Q3 may be seen to be identical as between FIGS. 9 and 10.

To further explore the parameters of the described process, a series of experiments were run, using the same PZT cell structure whose P/V characteristics are illustrated in FIGS. 5, 7, and 8. In these experiments the magnitude of the secondary pulse, applied at time t2, was varied from −1V to −5V (after a first pulse, at about Vcc=5V, was applied at time t1). As these results show, the magnitude of the secondary pulse is relatively uncritical, and need not be precisely controlled.

Alternative Embodiment: Negative-before-Positive Drive Pulses

In an alternative embodiment, the voltage pulses can be inverted. In this case the drive line would be driven:
below the DC bias level (e.g. to ground rather than to Vcc)
 at time t1, to transfer a signal-dependent voltage onto the bitline; and
above the DC bias level (e.g. to 0.75*Vcc instead of 0.25*Vcc) at time t2, to cancel the polarization of the ferroelectric.

Alternative Embodiment: Charge-Pumped Drive Pulses

In alternative embodiments, it is contemplated that a voltage above Vcc or below ground could be used at time t1. This would be attractive if the ferroelectric film used has a hysteresis curve which (unlike that of FIG. 5) does not converge within the voltage range available from the unboosted supply voltages. However, such boosting will tend to cause additional stress on components.

Alternative Embodiments with Dummy Cells

It should also be noted that the use of bipolar drive pulses according to the present invention is NOT strictly limited to architectures without a dummy cell. Even in architectures where a dummy cell is used to help sensing, the use of a complementary pair of pulses to restore a cell to an unpolarized state after a destructive read, is still expected to provide some advantages.

According to various disclosed embodiments, there is provided: A method of reading a ferroelectric memory cell, comprising the steps of: (a.) providing a first pulse in a first direction onto a first terminal of a ferroelectric capacitor, to provide a charge output, at a second terminal of said capacitor, which indicates the poling of the dielectric in said capacitor; (b.) after said first pulse, providing a second pulse in a second direction, which is opposite said first direction, onto said first terminal; and after said step (b.), sensing the voltage of said second terminal.

According to various disclosed embodiments, there is provided: A method of operating a ferroelectric memory, comprising the steps of:

(a.) accessing a desired ferroelectric cell capacitor; (b.) providing a first pulse in a first direction onto a first terminal of said selected capacitor, to provide a charge output, at a second terminal of said capacitor, which indicates the poling of the dielectric in said capacitor;

(c.) after said first pulse, providing a second pulse in a second direction, which is opposite said first direction, onto said first terminal; and (d.) differentially sensing the output voltage of a bit line which is connected to said second terminal, with respect to the output voltage of a bit line which is connected to another plurality of cells but not to any selected cell nor to any dummy cell.

According to various disclosed embodiments, there is provided: A memory comprising: an array of ferroelectric memory cells, each comprising a ferroelectric capacitor, and a pass transistor having a gate connected to a respective word line, and having current-carrying terminals which are connected, in series with said capacitor, between a respective drive line connection and a respective bit line connection; and access circuitry which is connected to turn on said pass transistor of a selected cell, and to automatically apply two pulses of opposite signs to said drive line connection of said selected cell.

According to various disclosed embodiments, there is provided: A memory comprising: an array of ferroelectric memory cells, each consisting of a single ferroelectric capacitor, and a pass transistor having a gate connected to a respective word line, and having current-carrying terminals which are connected, in series with said capacitor, between a respective drive line connection and a respective bit line connection; and access circuitry which is connected to turn on said pass transistor of a selected cell, and to automatically apply two pulses of opposite signs to said drive line connection of said selected cell; and a sense amplifier connected to sense the voltage on said bitline connection of said selected cell by a differential sensing operation against another bitline, without any dummy cell being activated.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the exact voltages used are not strictly necessary. The voltage Vcc/2 is selected to minimize stress, as is conventional, but of course other values can be used. Similarly, the exact value of Vcc/4 is not critical, but merely has to be somewhere between Vcc/2 and zero Volts.

It is also possible to use a more complex drive waveform, with additional pulses or delays added to the two drive pulses shown in the basic embodiment.

For another example, a variety of clocked or self-timing schemes for sensing can be used, as is well known by those skilled in the art.

What is claimed is:

1. A method of reading a ferroelectric memory cell, comprising the steps of:
    (a.) providing a first pulse in a first direction onto a first terminal of a ferroelectric capacitor, to provide a charge output, at a second terminal of said capacitor, which indicates the poling of the dielectric in said capacitor, said first pulse of magnitude sufficient to reverse polarity of said ferroelectric when said first direction is opposite the polarity of said ferroelectric;
    (b.) after said first pulse, providing a second pulse in a second direction, which is opposite said first direction, onto said first terminal, wherein said second pulse of smaller magnitude than said first pulse; and
    (c.) after said step (b.), sensing the voltage of said second terminal.

2. The method of claim 1, wherein said second pulse is smaller in magnitude than said first pulse.

3. The method of claim 1, wherein said second pulse is shorter in duration than said first pulse.

4. The method of claim 1, wherein said second pulse is negative-going and said first pulse is positive-going.

5. The method of claim 1, wherein a positive bias voltage follows said second pulse and precedes said first pulse.

6. A method of operating a ferroelectric memory, comprising the steps of:
    (a.) accessing a desired ferroelectric cell capacitor;
    (b.) providing a first pulse in a first direction onto a first terminal of said capacitor, to provide a charge output, at a second terminal of said capacitor, which indicates the poling of the dielectric in said capacitor, said first pulse of magnitude sufficient to reverse polarity of said ferroelectric when said first direction is opposite the polarity of said ferroelectric;
    (c.) after said first pulse, providing an abutting second pulse in a second direction, which is opposite said first direction, onto said first terminal; and
    (d.) differentially sensing the output voltage of a bit line which is connected to said second terminal, with respect to the output voltage of a bit line which is connected to another plurality of cells but not to any selected cell nor to any dummy cell.

7. The method of claim 6, wherein said second pulse is smaller in magnitude than said first pulse.

8. The method of claim 6, wherein said second pulse is shorter in duration than said first pulse.

9. The method of claim 6, wherein a positive bias voltage follows said second pulse and precedes said first pulse.

10. The method of claim 6, wherein said second pulse is negative-going and said first pulse is positive-going.

11. A memory comprising:
    an array of ferroelectric memory cells, each comprising
        a ferroelectric capacitor, and
        a pass transistor having a gate connected to a respective word line, and having current-carrying terminals which are connected, in series with said capacitor, between a respective drive line connection and a respective bit line connection; and
    access circuitry which is connected to turn on said pass transistor of a selected cell, and to automatically apply first and second abutting pulses of opposite signs to said drive line connection of said selected cell said first pulse of magnitude sufficient to reverse polarity of said ferroelectric when said first direction is opposite the polarity of said ferroelectric.

12. The memory of claim 11, wherein said second pulse is smaller in magnitude than said first pulse.

13. The memory of claim 11, wherein said second pulse is shorter in duration than said first pulse.

14. The memory of claim 11, wherein a positive bias voltage follows said second pulse and precedes said first pulse.

15. The memory of claim 11, wherein said second pulse is negative-going and said first pulse is positive-going.

16. The memory of claim 11, wherein said ferroelectric capacitor comprises a thin dielectric of a perovskite material.

17. A memory comprising:

an array of ferroelectric memory cells, each consisting of
a single ferroelectric capacitor, and
a pass transistor having a gate connected to a respective word line, and having current-carrying terminals which are connected, in series with said capacitor, between a respective drive line connection and a respective bit line connection; and access circuitry which is connected to turn on said pass transistor of a selected cell, and to automatically apply first and second abutting pulses of opposite signs to said drive line connection of said selected cell said first pulse of magnitude sufficient to reverse polarity of said ferroelectric when said first direction is opposite the polarity of said ferroelectric; and a sense amplifier connected to sense the voltage on said bitline connection of said selected cell by a differential sensing operation against another bitline, without any dummy cell being activated.

18. The memory of claim 17, wherein said second pulse is smaller in magnitude than said first pulse.

19. The memory of claim 17, wherein said second pulse is shorter in duration than said first pulse.

20. The memory of claim 17, wherein a positive bias voltage follows said second pulse and precedes said first pulse.

21. The memory of claim 17, wherein said second pulse is negative-going and said first pulse is positive-going.

* * * * *

UNITED STATES PATENT AND TRADEMARK OFFICE
CERTIFICATE OF CORRECTION

PATENT NO. : 6,363,002 B1
DATED : March 26, 2002
INVENTOR(S) : Akitoshi Nishimura and Katsuhiro Aoki It is certified that error appears in the above-identified patent and that said Letters Patent is hereby corrected as shown below:

<u>Title page,</u>
Item [60], Related U.S. Application Data, insert -- Provisional Application No. 60/070,224 filed 12/31/1997. --

Signed and Sealed this

Fourth Day of November, 2003

JAMES E. ROGAN
*Director of the United States Patent and Trademark Office*